United States Patent [19]

Kressel et al.

[11] 4,122,410

[45] Oct. 24, 1978

[54] LATERAL MODE CONTROL IN SEMICONDUCTOR LASERS

[75] Inventors: Henry Kressel, Elizabeth; Frank Zgymunt Hawrylo, Trenton, both of N.J.

[73] Assignee: RCA Corporation, New York, N.Y.

[21] Appl. No.: 797,402

[22] Filed: May 16, 1977

[51] Int. Cl.² .............................................. H01S 3/19
[52] U.S. Cl. ................................ 331/94.5 H; 357/18
[58] Field of Search ..................... 331/94.5 H; 357/18

[56] References Cited

U.S. PATENT DOCUMENTS 3,916,339  10/1975  Ladany et al. ................. 331/94.5 H
4,001,719  1/1977  Krupka ........................... 331/94.5 H Primary Examiner—Stanley D. Miller, Jr.
Assistant Examiner—James W. Davie
Attorney, Agent, or Firm—H. Christoffersen; B. E. Morris; D. S. Cohen

[57] ABSTRACT

A semiconductor laser capable of fundamental lateral mode operation, includes a region of high conductivity in the form of a stripe in a semiconductor body and at a contacting surface of the body. The high conductivity region is between and contiguous to a pair of spaced regions also in the body and at the contacting surface. The pair of spaced regions are of a lower conductivity than the high conductivity region. The low and high conductivity regions are in electrical contact with a stripe contact and provide a focused current distribution from the stripe contact which is compatible with fundamental lateral mode operation of the laser.

8 Claims, 2 Drawing Figures

LATERAL MODE CONTROL IN SEMICONDUCTOR LASERS

BACKGROUND OF THE INVENTION

The Government has rights in this invention pursuant to Contract No. N00014-76-C-0709 awarded by the Department of the Navy.

The present invention relates to semiconductor laser devices and more specifically to semiconductor laser devices having improved lateral mode control.

Semiconductor lasers, in general, are bodies of single crystalline semiconductor material which, when suitably biased, emit electromagnetic radiation, either visible or infrared, due to the recombination of pairs of oppositely charged carriers. These devices generally include regions of opposite conductivity types forming a PN junction therebetween and include a resonant cavity, typically of the Fabry-Perot type.

It is well known to those skilled in the laser art that the electromagnetic radiation in the laser cavity consists of a finite number of modes, divided into longitudinal, transverse and lateral modes. The longitudinal modes are related to the length of the Fabry-Perot cavity and to the index of refraction and its dispersion. The lateral modes, in the plane of the junction and in the direction perpendicular to the two facets defining the Fabry-Perot cavity, are dependent on the refractive index distribution as well as the current distribution which determines the means whereby the device is excited to threshold. The transverse modes of the cavity (direction perpendicular to the junction plane) are determined by the effective width of the mode guiding region in the transverse direction. It is generally desirable to limit the number of modes in a particular direction in the laser.

The proliferation of longitudinal modes is highly undersirable for many laser uses because they give rise to a spectral line width which is wider than desired. Therefore, the reduction of the number of longitudinal modes to a minimal value of one is desirable and U.S. Pat. No. 3,916,339 to I. Ladany et al, issued Oct. 28, 1975, teaches how this is done with an appropriate laser diode structure. Lasers can be constructed which operate only in the fundamental transverse mode as taught in U.S. Pat. No. 3,747,016, Kressel et al, issued July 17, 1973.

Limiting the emitted electromagnetic radiation beam to the fundamental lateral mode has proved to be a difficult undertaking. Attempts have been made to achieve fundamental lateral mode operation of lasers by confining the optical gain region to a long, narrow stripe across the body and perpendicular to the cleaved mirror facet surfaces forming the Fabry-Perot cavity. These attempts have been done by using narrow stripe electrical contacts near the recombination region. Generally, such contacts do not provide enough mode selectivity to assure fundamental mode operation, especially at high drive current levels.

The operation of a semiconductor laser in only the fundamental lateral mode is desirable since the emitted electromagnetic radiation beam has a single lobed far-field pattern. A radiation beam containing higher order modes in the lateral direction has a multi-lobed far-field pattern. Fundamental lateral mode lasers are more easily integrated into certain optical systems than higher order mode devices. For example, in the case of optical fiber transmission, improved radiation coupling into fibers is achieved using a laser diode with fundamental lateral mode emission. Also the single lobe of the fundamental lateral mode is conveniently focused to a small spot, making possible application such as scanners and encoding devices. Therefore, it would be most beneficial to be able to operate a semiconductor laser in only the fundamental lateral mode.

SUMMARY OF THE INVENTION

A semiconductor laser capable of fundamental lateral mode operation includes a body having opposed contact surfaces, opposed facet surfaces and two contiguous regions of opposite conductivity, one region extending along one contact surface and the other region extending along the opposite contact surface. In one of the regions and at the one contact surface is a third region in the form of a stripe extending from one facet surface to the opposite facet surface. A pair of spaced regions are also at the one contact surface and in the one region. The third region is between and contiguous to the pair of spaced regions. The third region is of a higher degree of conductivity than the one region and the pair of spaced regions are of a lower degree of conductivity than the third region but of a higher degree of conductivity than the one region. A stripe contact makes electrical contact to the third region and portions of the pair of spaced regions. When the laser device is forward biased, the third region and pair of spaced regions distribute the current flow through the body so as to be compatible with fundamental lateral mode operation.

DETAILED DESCRIPTION OF THE INVENTION

Figure 1:
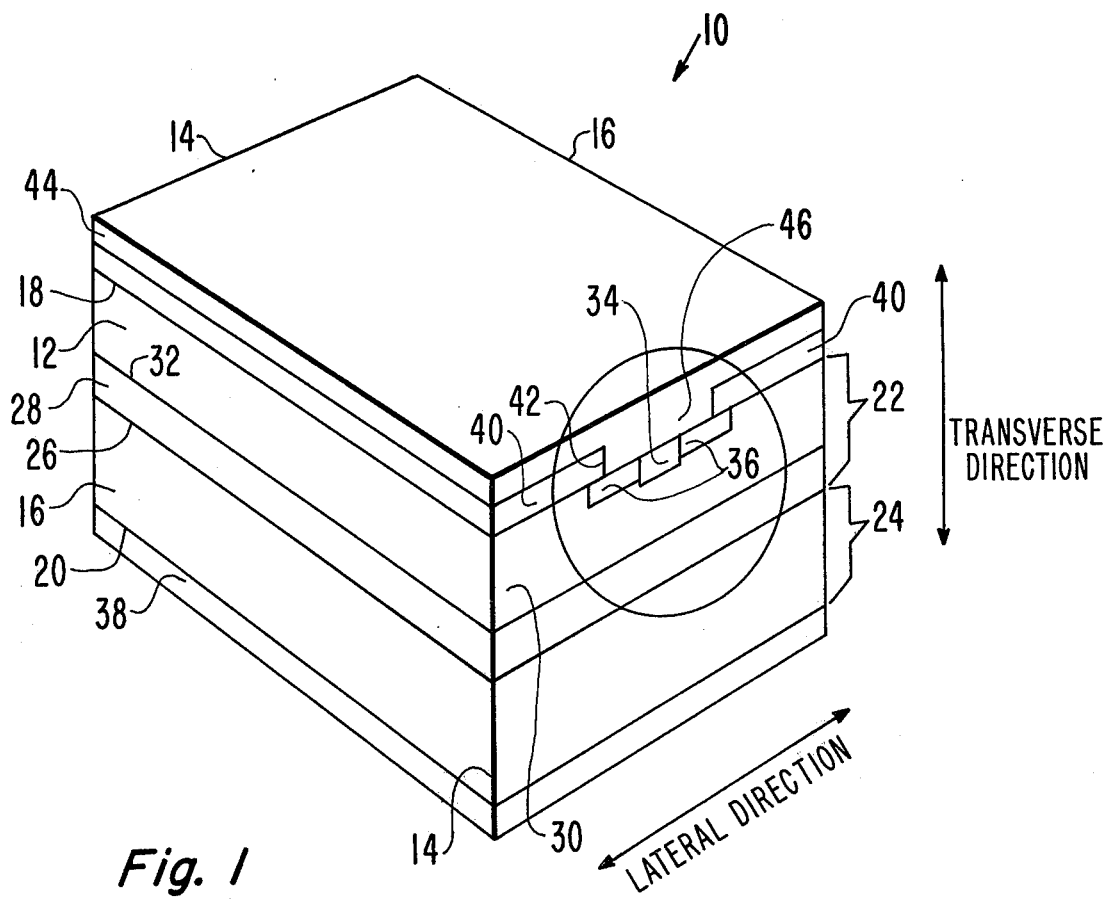
FIG. 1 is a perspective view of the semiconductor laser of the present invention.

Referring to FIG. 1, the semiconductor laser device of the present invention capable of fundamental lateral mode operation is designated as 10. The semiconductor laser 10 includes a body 12 of semiconductor material capable of emitting electromagnetic radiation. Typically, the body 12 is of semiconductor materials found in groups III and V of the Periodic Table of Elements. The body 12 is a rectangular parallelepiped having opposed facet surfaces 14, opposed side surfaces 16 extending to the facet surfaces 14 and opposed first and second contact surfaces 18 and 20 respectively. The first and second contact surfaces 18 and 20 extend to the facet surfaces 14 and side surfaces 16. Usually, the facet surfaces 14 are partially reflecting to the generated electromagnetic radiation. The body 12 has a lateral direction from side surface 16 to side surface 16, and a transverse direction from first contact surface 18 to second contact surface 20.

Body 12 includes a first region 22 of one conductivity type extending along the first contact surface 18 and a second region 24 of an opposite conductivity type extending along the second contact surface 20 and contiguous to the first region 22 forming a PN junction 26 therebetween. For the purpose of describing the semiconductor laser of the present invention, the first region will include first and second contiguous layers 28 and 30. The first layer 28 is adjacent the PN junction 26. The second layer 30 is contiguous to the first layer 28 and extends along the first contact surface 18. The semiconductor laser 10 is assumed to be a double heterojunction device with the second layer 30 and second region 24 of the same semiconductor material and the first layer 28 of a different semiconductor material. Consequently, the PN junction 26 is a heterojunction and the junction between the first and second layers 28 and 30 is also a heterojunction, hereinafter designated as heterojunction 32. The semiconductor material of the second layer 30 and second region 24 is of a lower index of refraction than the semiconductor material of the first layer 28. For example, the second layer 30 and second region 24 are of gallium aluminum arsenide (GaAlAs) and the first layer is of gallium arsenide (GaAs). It is assumed that the second region 24 is of N type conductivity, with a conductivity modifier concentration in the range of $10^{17}$ to $10^{18} cm^{-3}$ while the first region 22 is of P type conductivity. However, it is to be understood that the conductivities can be opposite of that described. Specifically, as to the first region 22, the first layer 28 could be intrinsic or have a conductivity modifier concentration to $10^{17} cm^{-3}$, while the second layer 30 has a conductivity modifier concentration in the range of about $10^{16}$ to $10^{17} cm^{-3}$.

A third region 34 is at the first contact surface 18 and extends into the first region 22, specifically the second layer 30. The third region 34 extends from one facet surface 14 to the opposite facet surface 14 and is spaced from the side surfaces 16, i.e., the third region 34 is of a strip shape. The third region is of the same conductivity type as the first region 22 but of a higher degree of conductivity, i.e., of a higher conductivity modifier concentration. A pair of spaced regions 36 extend from the first contact surface 18 into the first region 22, specifically, the second layer 30. The pair of spaced regions 36 extends from one facet surface 14 to the opposite facet surface 14 with the third region 34 between and contiguous to each of the pair of spaced regions 36. The pair of spaced regions 36 are of the same conductivity type as the third region 34 but of a lower degree of conductivity. However, the pair of spaced regions are of a higher degree of conductivity than the first region 22. Typically, the third region 34 is of a conductivity modifier concentration on the order of $10^{19}$ to $10^{20} cm^{-3}$, while the pair of spaced regions 36 have a conductivity modifier concentration on the order of $10^{18} cm^{-3}$. By way of example, the third region 34 extends into the second layer 30 a depth of about 0.2 to 0.3 micrometer, and the pair of spaced regions extend into the second layer 30 a depth of about 0.1 micrometer.

On the second contact surface 20 are means for making electrical contact thereto, such as a conductive layer 38 capable of forming an ohmic contact with the second region 24. The conductive layer 38 can be of a metal such as aluminum, or of metals such as gold and chromium.

On the first contact surface 18 is an electrically insulating layer 40 of a material such as silicon dioxide. The insulating layer 40 has a stripe opening 42 which extends from one facet surface 14 to the opposite facet surface 14. The stripe opening 42 is disposed on the first contact surface 18 so as to expose the third region 34 at the first contact surface 18, and at least portions of the pair of spaced regions 34 also at the first contact surface 18. The opening 42 can be no wider in the lateral direction than to expose the third region 34 and all of the pairs of spaced regions 34 at the first contact surface 18. On the insulating layer 40 and in the opening 42 is an electrically conductive layer 44. The electrically conductive layer 44 is in the stripe opening 42 forming a stripe electrical contact 46 to the third region 34 and the pair of spaced regions 36. Generally, the electrically conductive layer 44 and stripe contact 46 are of metals such as gold and chromium which are suitable for forming an ohmic contact with the third region 34 and the pair of spaced regions 36. The stripe electrical contact 46 will have a lateral width, for example, of approximately 15 micrometers while the third region 34 has approximately a 5 micrometer lateral width and each of the pair of the spaced regions 36 is at least 5 micrometers in its lateral width. Typically, the ratio of lateral width of the electrical contact 46 to the lateral width of the third region 34 is approximately 3 to 1.

In the operation of the semiconductor laser 10, a forward bias voltage is applied to the body 12 by connecting the electrically conductive layer 44 and electrically conductive layer 38 to a voltage source (not shown) which causes current to flow in the body 12 between the stripe electrical contact 46 and the electrical conductive layer 38. More details are forthcoming as to the character of the generated current. As a result of the applied forward bias voltage, charged carriers are injected into the first layer 28 from the second region 24 and second layer 30. The charge carriers recombine in the first layer 28 with majority carriers to generate optical radiation, which is in the form of electromagnetic waves.

Figure 2:
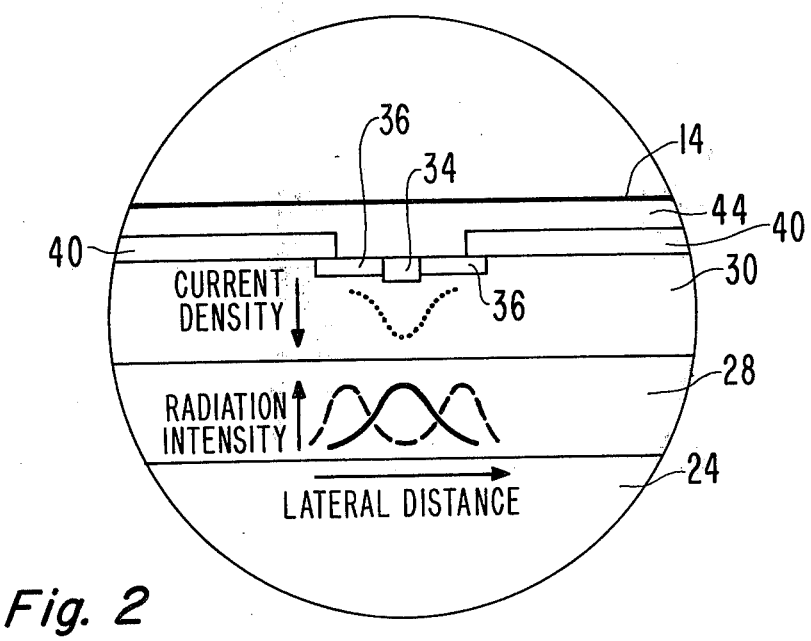
FIG. 2 is an enlarged view of the encircled portion of FIG. 1 with the fundamental lateral mode (solid line), the second order lateral mode (dashed line) and the focused current flow (dotted line) superimposed on a facet surface.

As stated, when the laser 10 is forward biased current flows from the stripe contact 46 to the electrically conductive layer 28. In a laser as described above, in the absence of the third region 34 and paired spaced regions 36, as the current flows there is a flaring out of the current along its path, and the current is sufficiently broad in the lateral direction to excite the fundamental and higher order mode radiation. However, in the laser 10 of the present invention, since the third region 34 is of a higher conductivity than the contiguous pair of spaced regions 34, most of the current will be focused into the body 12 from the third region 34 with a lesser amount of current flowing from the pair of spaced regions 36. That is to say, the current distribution in the vicinity of the stripe electrical contact 46 is controlled by the difference in conductivities of the third region 34 and the pair of spaced regions 36 in a manner which results in the current being constricted to a reasonable extent at the center of the stripe electrical contact 46, producing a current focusing effect. This current focusing results in the preferential excitation of the fundamental lateral mode which has a radiation intensity maximum at the center of the focused current, whereas the higher order modes have intensity maxima which are not efficiently excited by the focused current. The current distribution from the third region 36 and pair of spaced regions 34 has somewhat of a bell shape distribution which is much more conducive to operation in the fundamental lateral mode. FIG. 2 shows the fundamental lateral mode (solid line), the second distribution (dotted line) superimposed and the focused current flow (dotted line) superimposed on a facet surface 14. Referring to FIG. 2, one can see that the focused current flow of the laser 10 will preferentially excite the fundamental lateral mode having s single intensity maximum. Other higher order modes, for example, the second order mode as shown in FIG. 2, has two intensity maxima and would not be as efficiently excited by the focused current flow. The combination of the highly conductive third region 34 and the lower conductive pair of spaced regions 36 provides the single lateral mode operation of the present invention.

As previously described, the second layer 30 and second region 24 are of a lower index of refraction than the first layer 28. Internal reflection of electromagnetic radiation results from the interaction of electromagnetic waves traveling in a higher index of refraction medium striking, at a low angle, an interface with a medium of lower refractive index. Consequently, the radiation generated within the first layer 28 is substantially confined in a transverse direction between the heterojunctions 26 and 32.

That portion of the body 12 through which the current flows, has a higher index of refraction than the remaining portion of the body 12, due to the optical gain in that portion density and as a result of the heating effect of the current flow. Thus, the difference in the index of refraction in the lateral direction, due to the localization of the current, in conjunction with the difference in index of refraction in the transverse direction, as a result of the heterojunctions 26 and 32, forms an optical waveguide in the body 12. That portion of the body 12 which is bound by the optical waveguide includes therein what those skilled in the art refer to as the active or recombination region of the laser 10, i.e., the region wherein minority and majority carriers recombine resulting in the generation of electromagnetic radiation. The optical waveguide substantially confines the optical radiation generated within the body 12.

Electromagnetic radiation generated within the first layer 28 will propagate along the optical waveguide in the general direction of the facet surfaces 14. Typically, both of the facet surfaces are partially reflecting to the electromagnetic radiation. Consequently, when the guided waves of radiation strike the facet surface it may be reflected back into the cavity where it continues to stimulate carrier recombination. Thus, the electromagnetic radiation is amplified. Eventually, some of the amplified electromagnetic radiation is emitted as coherent optical radiation at the partially reflecting facet surfaces 14.

In the fabrication of the semiconductor laser 10, the body 12 is fabricated by conventional liquid phase epitaxial techniques such as described in U.S. Pat. No. 3,897,281 issued July 29, 1975, to S. L. Gilbert et al. The third region 34 and pair of spaced regions 36 are formed by a double diffusion process, as subsequently discussed. After the body 12 is formed, a mask is then deposited on what is to be the first contacting surface 18. In the mask is a stripe opening having a width in the lateral direction so as to define the pair of spaced regions 36, and the space therebetween. The body 12 and the mask are then placed in a diffusion furnace. In the diffusion furnace the body is heated to a temperature of approximately 800° C. in an atmosphere containing an acceptor type conductivity modifier such as zinc. The zinc is diffused into the first contacting surface 18 at the opening of the mask for approximately 5 minutes to form a diffused region of a conductivity modifier concentration of about $10^{18} cm^{-3}$. The mask is then chemically removed and a second mask is deposited on the first contacting surface 18 by conventional evaporation techniques. The second mask has a striped opening having a lateral width such as to define the lateral width of what is to be the third region 34. The stripe opening of the second mask is longitudinally located in approximately the center of the formed diffused region. The body 12 and the second mask are again placed in the diffusion furnace where the body 12 is subjected to a temperature of approximately 800° C. in an atmosphere containing an acceptor type conductivity modifier such as zinc. The zinc is diffused through the opening in the second mask and into the body 12 for about 2 minutes so as to form the third region 34 having a conductivity modifier concentration of $10^{19}$ to $10^{20}$ and define the pair of spaced regions 36. An insulation layer is then deposited on the first contacting surface 18 and the stripe opening 42 is formed in the insulation layer by conventional etching techniques. The stripe opening 42 is adjacent the third region 34 and at least a portion of the pair of spaced regions 36. Next, the electrically conductive layer 44 forming the stripe contact 46 and the electrically conductive layer 38 are formed by conventional state of the art evaporation techniques. The device 10 is then subjected to cleaving so as to form the side surfaces 16 and facet surfaces 14.

FIG. 2 shows the novel configuration of the present invention in greater detail, showing the focused current distribution as a result of the third region 34 and the pair of spaced regions 36.

The semiconductor laser device 10 of the present invention provides a coherent electromagnetic radiation beam capable of operation in the fundamental lateral mode.

We claim:
1. A semiconductor laser device comprising:
a body of semiconductor material capable of emitting coherent electro-magnetic radiation having opposed first and second contact surfaces, opposed side surfaces extending to said first and second contact surfaces, opposed facet surfaces extending to said side surfaces and said first and second contact surfaces, a first region of one conductivity type extending along said first contact surface, a second region of the opposite conductivity type extending along said second contact surface and contiguous to said first region, said first region including an active portion extending along the second region, said active portion being of a material which forms a heterojunction with each of the second region and the remaining portion of the first region;
a third region at said first contact surface and extending into said first region toward but being spaced from the active portion of said first region, said third region extending from one facet surface to said opposite facet surface and spaced from said side surfaces, said third region of the same conductivity type and of a higher degree of conductivity than said first region;
a pair of spaced regions at said first contact surface and extending into said first region toward but being spaced from the active portion of said first region, said pair of spaced regions extending from one facet surface to said opposite facet surface with said third region between and contiguous to said pair of spaced regions, said pair of spaced regions being of the same conductivity type and a lower degree of conductivity than said third region, said pair of spaced regions being of a higher degree of conductivity than said first region;
a layer of electrically insulating material on said first contact surface, said layer having a stripe opening extending from one facet surface to said opposite facet surface, said third region and at least portions of said pair of spaced regions at said first contact surface being at said opening; and an electrically conductive layer on said insulating layer and in said stripe opening forming a stripe electrical contact to said third region and said pair of spaced regions.

2. The semiconductor laser in accordance with claim 1 wherein said first region further comprises a first layer adjacent said junction of said first and second regions, and a second layer extending along said first contact surface and contiguous to said first layer, said first layer being the active portion of said first region.

3. The semiconductor laser in accordance with claim 2 wherein said first region is of P type conductivity and said second region is of N type conductivity.

4. The semiconductor laser in accordance with claim 3 wherein said second region is of a conductivity modifier concentration in the range of about $10^{17}$ to $10^{18}$cm$^{-3}$, said first layer is intrinsic or of a conductivity modifier concentration to $10^{17}$cm$^{-3}$, said second layer is of a conductivity modifier concentration in the range of about $10^{16}$ to $10^{17}$cm$^{-3}$, said third region is of a conductivity modifier concentration in the range of about $10^{19}$ to $10^{20}$cm$^{-3}$, and said pair of spaced regions is of a conductivity modifier concentration of about $10^{18}$cm$^{-3}$.

5. The semiconductor laser in accordance with claim 4 wherein said second layer and second region are of a semiconductor material different from that of said first layer and of a lower index of refraction than the material of said first layer.

6. The semiconductor device in accordance with claim 1 further comprising an electrically conductive layer contiguous to said second region at said second contact surface.

7. The semiconductor laser in accordance with claim 1 wherein said third region extends into said first region a depth of about 0.2 to 0.3 micrometer, and said pair of spaced regions extends into said first region a depth of about 0.1 micrometer.

8. The semiconductor laser in accordance with claim 1 wherein the ratio of the lateral width of the stripe contact to the lateral width of the third region is approximately 3 to 1.

* * * * *